United States Patent
Finkelstein

(10) Patent No.: US 11,296,137 B2
(45) Date of Patent: Apr. 5, 2022

(54) HIGH QUANTUM EFFICIENCY GEIGER-MODE AVALANCHE DIODES INCLUDING HIGH SENSITIVITY PHOTON MIXING STRUCTURES AND ARRAYS THEREOF

(71) Applicant: Sense Photonics, Inc., Durham, NC (US)

(72) Inventor: Hod Finkelstein, Berkeley, CA (US)

(*) Notice: Subject to any disclaimer, the term of this patent is extended or adjusted under 35 U.S.C. 154(b) by 333 days.

(21) Appl. No.: 16/668,271

(22) Filed: Oct. 30, 2019

(65) Prior Publication Data

US 2020/0135776 A1 Apr. 30, 2020

Related U.S. Application Data

(60) Provisional application No. 62/775,105, filed on Dec. 4, 2018, provisional application No. 62/752,718, filed on Oct. 30, 2018.

(51) Int. Cl.
*H01L 27/146* (2006.01)
*H01L 31/0232* (2014.01)
(Continued)

(52) U.S. Cl.
CPC ........ *H01L 27/1463* (2013.01); *G01S 7/4816* (2013.01); *G01S 17/08* (2013.01);
(Continued)

(58) Field of Classification Search
CPC .......... G01S 13/00; G01S 17/00; G01S 17/06; H01L 27/146; H01L 31/023; H01L 31/107
(Continued)

(56) References Cited

U.S. PATENT DOCUMENTS 8,679,959 B2 3/2014 Carey et al.
10,707,247 B2 * 7/2020 Tian .................... H04N 9/04555
(Continued)

FOREIGN PATENT DOCUMENTS

KR 10-2014-0108940 A 9/2014

OTHER PUBLICATIONS

Notification of Transmittal of the International Search Report and the Written Opinion of the International Searching Authority, or the Declaration, in corresponding PCT Application No. PCT/US2019/058717 (13 pages) (dated Feb. 21, 2020).
(Continued)

*Primary Examiner* — Que Tan Le
(74) *Attorney, Agent, or Firm* — Myers Bigel, P.A.

(57) ABSTRACT

A photodetector device includes a semiconductor material layer and at least one photodiode in the semiconductor material layer. The at least one photodiode is configured to be biased beyond a breakdown voltage thereof to generate respective electrical signals responsive to detection of incident photons. The respective electrical signals are independent of an optical power of the incident photons. A textured region is coupled to the semiconductor material layer and includes optical structures positioned to interact with the incident photons in the detection thereof by the at least one photodiode. Two or more photodiodes may define a pixel of the photodetector device, and the optical structures may be configured to direct the incident photons to any of the two or more photodiodes of the pixel.

26 Claims, 5 Drawing Sheets

(51) Int. Cl.
*H01L 31/0236* (2006.01)
*G01S 17/08* (2006.01)
*H01L 31/107* (2006.01)
*G01S 7/481* (2006.01)

(52) U.S. Cl.
CPC .... *H01L 27/14636* (2013.01); *H01L 31/0232* (2013.01); *H01L 31/02366* (2013.01); *H01L 31/107* (2013.01)

(58) Field of Classification Search
USPC .................................. 250/208.1, 214 R, 221
See application file for complete search history.

(56) References Cited

U.S. PATENT DOCUMENTS

| | | |
|---|---|---|
| 2007/0290265 A1 | 12/2007 | Augusto et al. |
| 2010/0148040 A1 | 6/2010 | Sanfilippo et al. |
| 2012/0146172 A1 | 6/2012 | Carey et al. |
| 2013/0193546 A1 | 8/2013 | Webster et al. |
| 2014/0291481 A1 | 10/2014 | Zhang et al. |
| 2016/0043119 A1 | 2/2016 | Lee et al. |
| 2019/0250257 A1 | 8/2019 | Finkelstein et al. |

OTHER PUBLICATIONS

Yokogawa et al. "IR sensitivity enhancement of CMOS Image Sensor with diffractive light trapping pixels" Scientific Reports 7:3832 (Jun. 19, 2017).

* cited by examiner

HIGH QUANTUM EFFICIENCY GEIGER-MODE AVALANCHE DIODES INCLUDING HIGH SENSITIVITY PHOTON MIXING STRUCTURES AND ARRAYS THEREOF

CLAIM OF PRIORITY

This application claims the benefit of priority from U.S. Provisional Patent Application No. 62/752,718 entitled "High Quantum Efficiency Geiger-Mode Avalanche Diodes and Arrays Thereof" filed on Oct. 30, 2018, and U.S. Provisional Patent Application No. 62/775,105 entitled "High Sensitivity Photon Mixing Structures" filed on Dec. 4, 2018, in the United States Patent and Trademark Office, the disclosures of which is incorporated by reference herein.

FIELD

The subject matter herein relates generally to image sensors, and more specifically to image sensors for imaging in LIDAR (Light Detection And Ranging) systems.

BACKGROUND

Time of flight (ToF) based imaging is used in a number of applications including range finding, depth profiling, and 3D imaging (e.g., LIght Detection And Ranging (LIDAR), also referred to herein as lidar). ToF 3D imaging systems may utilize direct ToF (dToF) measurement (where the length of time between emitting an optical signal and sensing or detecting the optical signal after reflection from an object or other target is measured to determine distance) or indirect ToF (iToF) measurement (where the amplitude of the emitted optical signal is modulated and the phase delay or phase shift of the reflected optical signal is measured, and the time required for the signal to travel to and from an object results in a phase shift that is proportional to the distance traveled). However, to illuminate a large field of view (FoV) (which may include long range and/or low-reflectivity targets in bright ambient light conditions) and receive a recognizable return or reflected optical signal therefrom (also referred to herein as an echo signal), higher optical emission power (and thus higher power consumption) may be required.

In some applications, such as lidar, it can be desirable to detect both very dim and very bright echo signals. For example, a 10% Lambertian-reflective target at a distance range of 200 meters (m) may reflect $1/200^2$ of the light reflected by a similar target at a distance of 1 m, may reflect $1/(10\times200^2)$ of the light reflected by a 100% Lambertian-reflective target at a distance range of 1 m, and may reflect about $1/(1000\times200^2)=1/40{,}000{,}000$ of the light reflected by a strong retroreflective target at a distance range of 1 m. The distance ranges may refer to distances between the target and the lidar detector array. Since some electronic circuits may have a fixed gain-bandwidth product, it may be difficult to detect both the very dim and the very bright targets with very high temporal accuracy.

Some conventional photodetector devices, such as described in U.S. Patent Application Publication No. 2012/0146172, may have a current responsivity which is proportional to the impinging or incident optical power, for example, 0.4 A/W. Such devices may thus have a limited ability to detect both very dim and very bright objects. The range of detection between dim and bright objects may be referred to as the dynamic range of a device. Such conventional photodetector devices may typically produce an analog signal in response to detection of an arriving optical signal. This analog signal may typically be sampled at above the Nyquist frequency, or at least twice the bandwidth of the required information. Such sampling can be expensive (e.g., in terms of footprint or "real-estate" on the device), difficult to parallelize, and/or may draw significant power.

To improve photodetector sensitivity, some conventional photodetector devices may include a surface modification of silicon to reduce reflectivity and increase the wavelength range of light absorption, also referred to as a layer of "black silicon," as described for example in U.S. Pat. No. 8,679,959. Light trapping structures may also be used to increase absorption probability. For example, some conventional diffractive light trapping structures are described in "IR sensitivity enhancement of CMOS Image Sensor with diffractive light trapping pixels" to Yokogawa et al.

SUMMARY

According to some embodiments, a photodetector device includes a semiconductor material layer, and at least one photodiode in the semiconductor material layer that is configured to be biased beyond a breakdown voltage thereof to generate respective electrical signals responsive to detection of incident photons, where the respective electrical signals are independent of an optical power of the incident photons. A textured region is coupled to the semiconductor material layer and includes optical structures positioned to interact with the incident photons in the detection thereof by the at least one photodiode.

In some embodiments, the at least one photodiode includes two or more photodiodes that define a pixel of the photodetector device, and the optical structures are configured to direct the incident photons to any of the two or more photodiodes of the pixel for the detection thereby.

In some embodiments, respective isolation regions separate the pixel from neighboring pixels of the photodetector device, and the pixel is free of the respective isolation regions between the two or more photodiodes thereof.

In some embodiments, the respective isolation regions include respective deep trench isolation (DTI) regions. A shallower trench isolation (SrTI) structure is provided between the two more photodiodes in the pixel, where the respective DTI regions protrude away from the two or more photodiodes beyond the SrTI structure.

In some embodiments, responsive to the detection of the incident photons by any of the two or more photodiodes, the respective electrical signals generated by the any of the two or more photodiodes are configured to be output to respective processing paths that include respective electronic circuit elements that are not shared by the two or more photodiodes of the pixel.

In some embodiments, a readout wafer includes the respective electronic circuit elements, and the semiconductor material layer is stacked on a surface of the readout wafer.

In some embodiments, the respective electronic circuit elements include respective quenching and/or recharge circuits.

In some embodiments, metal layer structures are provided in the readout wafer adjacent the surface thereof. The metal layer structures extend along and beneath the two or more photodiodes and are configured to provide electrical signals thereto or therefrom.

In some embodiments, the respective electronic circuit elements include an analog time integrator or an analog counter, and the metal layer structures include integrating or counting capacitors thereof.

In some embodiments, the optical structures are configured to direct the incident photons away from one of the two or more photodiodes of the pixel before the detection by the any of the two or more photodiodes.

In some embodiments, the optical structures are diffractive elements respectively including one or more dimensions smaller than a wavelength of the incident photons. In some embodiments, the diffractive elements may be inverted pyramidal array (IPA) structures.

In some embodiments, at least one of the two or more photodiodes in the pixel are configured to be disabled independent of one another, in some embodiments in response to a control signal that is generated in response to the respective electrical signals output therefrom.

In some embodiments, trench isolation regions separate the pixel from neighboring pixels of the photodetector device. First and second electrodes are configured to apply a reverse bias to the at least one of the two or more photodiodes of the pixel based on a voltage difference therebetween, where the voltage difference is switchable between a first voltage that is greater than the breakdown voltage, and a second voltage that is less than the breakdown voltage.

In some embodiments, the at least one photodiode includes at least one single photon avalanche detector (SPAD) having a respective semiconductor junction that includes a substantially planar region and a guard ring structure at edges of the substantially planar region.

In some embodiments, the photodetector device is an optical sensor array that includes the at least one photodiode among a plurality of pixels thereof. The optical sensor array is a light detection and ranging (LIDAR) detector array, and a source of the incident photons is a LIDAR emitter array.

According to some embodiments, an optical sensor array includes a plurality of pixels, each of the pixels including two or more photodiodes that are configured to generate respective electrical signals responsive to incident photons, where the respective electrical signals are independent of an optical power of the incident photons; respective isolation regions separating neighboring ones of the pixels; and optical structures positioned between the respective isolation regions and configured to direct the incident photons to any of the two or more photodiodes of each of the pixels.

In some embodiments, each of the pixels is free of the respective isolation regions between the two or more photodiodes thereof, and the optical structures are configured to direct the incident photons away from one of the two or more photodiodes of each of the pixels before detection by the any of the two or more photodiodes.

In some embodiments, the respective isolation regions include respective deep trench isolation (DTI) regions. A shallower trench isolation (SrTI) structure extends between the two more photodiodes in the pixel, where the respective DTI regions protrude away from the two or more photodiodes beyond the SrTI structure.

In some embodiments, the optical structures are diffractive elements respectively including one or more dimensions smaller than a wavelength of the incident photons. The diffractive elements are configured to direct the incident photons to the any of the two or more photodiodes of each of the pixels with optical path lengths that are greater than a distance between a surface of the optical sensor array and the one of the two or more photodiodes.

In some embodiments, the two or more photodiodes respectively include a semiconductive junction that includes a substantially planar region and a guard ring structure at edges thereof. The semiconductive junction is configured to be biased beyond a breakdown voltage thereof to generate the respective electrical signals responsive to the incident photons.

In some embodiments, responsive to detection of the incident photons by the any of the two or more photodiodes, the respective electrical signals generated by the any of the two or more photodiodes are configured to be output to respective processing paths that include respective electronic circuit elements that are not shared by the two or more photodiodes of each of the pixels.

In some embodiments, the pixels, the respective isolation regions, and the optical structures are provided in or on a first semiconductor layer, and a second semiconductor layer includes the respective electronic circuit elements. The first semiconductor layer is bonded to a surface of the second semiconductor layer.

In some embodiments, the second semiconductor layer further includes a controller that is configured to receive the respective electrical signals generated by the two or more photodiodes of each of the pixels and perform temporal correlation between respective times of arrival indicated by the respective electrical signals.

In some embodiments, the optical sensor array is a light detection and ranging (LIDAR) detector array, and a source of the incident photons is a flash LIDAR emitter array.

In some embodiments, the optical sensor array is a light detection and ranging (LIDAR) detector array, and a source of the incident photons is a scanning LIDAR emitter array.

According to some embodiments, a light detection and ranging (LIDAR) detector array includes a semiconductor material layer having a thickness of about 1 µm to about 100 µm; a plurality of pixels in the semiconductor material layer, the pixels respectively including at least one photodiode defined by a semiconductive junction that includes a substantially planar region and a guard ring structure at edges thereof and is configured to generate an electrical signal responsive to incident photons having wavelengths between about 800 nanometers (nm) to about 1200 nm when a reverse bias applied thereto is beyond a breakdown voltage thereof, where the electrical signal is independent of an optical power of the incident photons; respective deep trench isolation regions separating neighboring ones of the pixels; first and second contacts in each of the pixels adjacent the respective deep trench isolation regions, where the first and second contacts are configured to apply the reverse bias to the semiconductive junction based on a voltage difference therebetween; and diffractive optical elements positioned between the pixels and a source of the incident photons.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION

Figure 1A:
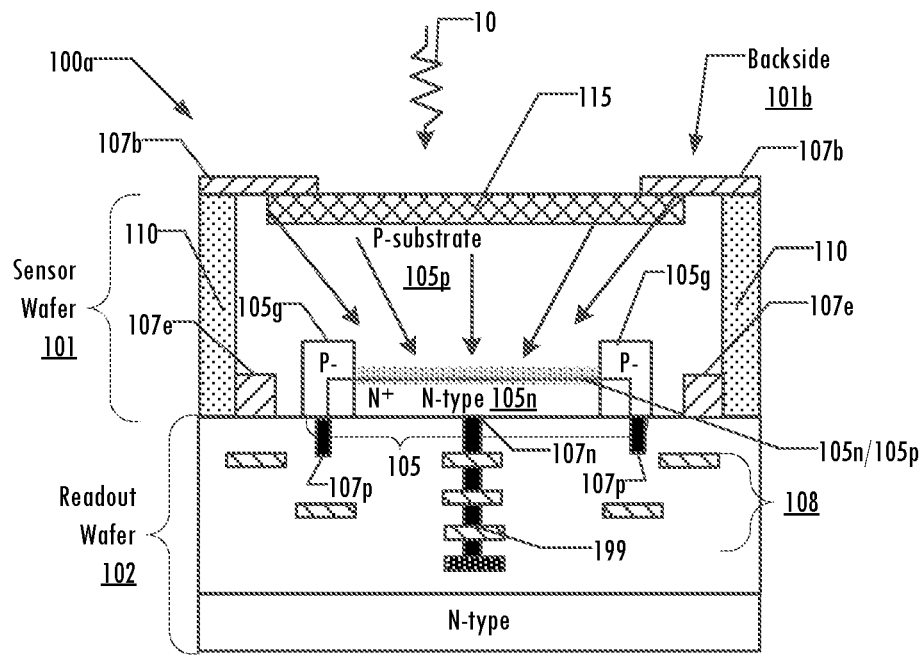
FIGS. 1A, 1B, and 1C are cross-sectional views illustrating example photodetector devices according to some embodiments of the present invention.

Sensitivity-enhanced CMOS image sensors may be designed to improve sensitivity of CMOS image sensors by forming subwavelength diffractive light trapping structures, such as inverted pyramidal array (IPA) structures, which refract sufficiently normally incident light at an angle such that it undergoes total internal reflection from the deep trench isolation (DTI) structures that separate each pixel from its neighboring pixels. This light travels a longer path in the silicon as compared with similarly normally incident light without the diffractive light trapping structures. The longer path can increase the probability of absorption and thus the sensitivity of the device. The DTI structures may prevent photons impinging above one pixel to generate charges which will be collected in adjacent pixels.

Such conventional devices may include photodetector devices having a current responsivity that is proportional to the optical power of the incident photons, such that the incident optical power is converted to a proportional current. Such photodetector devices, also referred to as sub-Geiger photodiodes, sub-Geiger avalanche photodiodes, or avalanche photodiodes (APDs), may have a limited dynamic range. Sub-Geiger photodiodes cannot be operated above breakdown voltage, for example, due to non-planar semiconductive junction regions that may be susceptible to premature breakdown when operated close to, at, or beyond the breakdown voltage of the planar region of the diode, which may result in damage or reduced reliability. Temporal responsivity may also be less accurate in typical implementations of such sub-Geiger photodiodes, thus limiting the ability of such sensors to accurately measure photons' times of arrival.

In contrast, embodiments of the present invention provide high quantum efficiency and/or high sensitivity photodetector devices including Geiger-mode photodiodes, which can generate electrical signals that are independent of the optical power of the incident photons. Some embodiments described herein are directed to Single-Photon Avalanche Diodes (SPADs), which are also known as Geiger-mode avalanche diodes. Particular embodiments are directed to silicon SPADs, but the invention is not limited to silicon and thus may be applied or generalized to include other semiconducting materials. That is, while described with reference to silicon, embodiments of the present invention can be implemented in other semiconductor materials suited for incorporation into optoelectronic devices.

In operation of Geiger-mode avalanche diodes, a reverse bias beyond a breakdown voltage of the diode is applied to create an electric field of sufficient magnitude such that a single charge carrier introduced into the depletion layer of the device may be accelerated to a point where it carries sufficient kinetic energy to create secondary charge pairs through a process called impact ionization. In this way, a single absorbed photon can trigger a self-perpetuating ionization cascade that will spread throughout the junction subjected to the electric field, which will break down and become conductive, effectively amplifying the original electron-hole pair into current flow. The avalanche can be quenched by a quench circuit, either actively or passively, which lowers the reverse voltage seen by the diode to a value below its breakdown voltage, thus halting the avalanche to allow the device to be "reset" to detect further photons.

The initiating charge carrier can be photo-electrically generated by a single incident photon striking the high field region. This single photon detection mode of operation is often referred to as 'Geiger mode.' A single SPAD sensor operated in Geiger-mode functions as a photon-triggered switch, in either an 'on' or 'off' state, which results in a binary output, regardless of the number of photons absorbed within a diode at the same time, it will produce a signal no different to that of a single photon.

Various implementations of Geiger-mode devices may be operated in frontside illuminated modes. Because of the lower absorption coefficient of silicon in red and near-infrared wavelengths, many of these devices can suffer from low Photon Detection Probability (PDP), on the order of less than 1 percent or a few percent. This deficiency may be partially addressed by forming deeper and/or broader junctions in the silicon. However, deeper and/or broader-depletion-region junctions are typically lower-doped and can thus suffer from breakdown-voltage non-uniformities, especially across arrays of devices. Furthermore, as the diameter and/or volume of the depletion and/or multiplication regions of these devices increases, the timing resolution may increase, which can translate to a broader jitter in the timing of the ensuing avalanche. Similarly, as the electrical path from the anode or cathode node to the junction increases or is curved, the series resistance may increase and the time required to quench the avalanche and the power dissipated during an avalanche can increase. Even with deeper junctions, PDP may be low, for example 2%.

Back-grinding the backside of the wafer to an appropriate thickness and illuminating from the back side may increase the interaction length between photons and the silicon, and thus, increase the probability of absorption of long-wavelength photons. Wafer thicknesses of approximately 3 to 6 micrometers have been demonstrated. The thin wafers may be bonded to a second CMOS wafer containing circuitry as required for proper operation of the device. However, even these backside illuminated devices typically provide only limited PDP, e.g., 4%. Further expansion of the absorption region may result in optical cross-talk due to the diffusion of charges to adjacent pixels. This diffusion may be reduced by creating electric fields which can partially contain these charges but as the silicon substrate depth increases, the ability to confine the photogenerated charges decreases. Also, while some devices may include an antireflective (AR) coating to increase sensitivity, and/or a metallization layer behind the photodiode for increasing the effective optical path length for photons in the silicon, photons which impinge normal to the surface of the SPAD may continue to travel in the same trajectory (e.g., without diffraction), and thus may not be afforded higher absorption probability.

Some embodiments of the present invention provide photodetector devices and sensor arrays including Geiger-mode photodiodes in combination with textured regions and/or isolation regions that are configured to increase the probability of absorption of the incident photons. For example, embodiments described herein may include optical structures (such as black silicon and/or diffractive light trapping structures) in or on one or more surfaces of a pixel that includes one or more photodiodes. In some embodiments, the optical structures may be between the photodiodes and a scene or field of view which is imaged thereby. Embodiments described herein may involve preparing a rough surface, e.g., using lasers, whereas diffractive optical elements as described herein provide structures, which may be on the order of a wavelength or below, that refract light from the surface of the sensor and away from the closest photodiode such that the optical path length of light in the silicon is increased and thus the absorption probability increases.

Designing SPAD-based focal plane imaging arrays may involve conflicting design targets. On the one hand, it can be desirable to reduce the physical sizes of the SPAD devices. The current flowing in a SPAD during an avalanche and during its recharge is directly proportional to its capacitance, which in turn is proportional to its area. Also, smaller, lower capacitance SPADs may offer a shorter dead time, can detect photons more often, and thus may have a higher dynamic range than larger SPADs. Thus, in order to reduce total current, power and heat dissipated by a single SPAD or, even more so, by a large arrays of SPADs, and in order to provide for a higher dynamic range, it can be desirable to reduce the area of the diode. Moreover, certain noise sources in the SPAD may be proportional to the SPAD area, such as afterpulsing. On the other hand, reducing the sizes of SPADs typically results in a reduction in fill factor, for example, due to guard ring structures that contain the avalanche and where detection is not possible. Moreover, the resolution of some optical systems may be determined by their optics, and this resolution can be lower than the pitch of small SPADs. The collection efficiency of microlenses is also a function of their size, and specifically, may be limited in their numerical aperture and thus can sometimes improve collection efficiency for lower pitch diodes.

Some embodiments of the present invention provide arrays of pixels, which maintain benefits of small SPAD devices, yet also provide advantages of lower pitch arrays. Specifically, some embodiments can provide for lower power operation without loss of collection efficiency or effective fill factor, and can be matched to the resolution of lower-cost optics with a reduced Point Spread Function.

Moreover, some embodiments of the present invention provide photon-mixing optoelectronic structures for detection of photons with increased sensitivity in pixels that include two or more photodiodes. Without loss of generality, in some embodiments each pixel contains more than one photodiode, but is positioned or otherwise used to image or sample one region of the field of view of a two-dimensional optical sensor. Thus, when a photon enters the aperture region corresponding to that pixel, this photon has an equal probability of being absorbed in any of the multiple photodiodes in the pixel. In some embodiments, each of the photodiodes in the pixel is configured to generate a respective electrical signal to be processed by a corresponding electronic circuit element. In some embodiments, the electrical signals from the more than one photodiodes in a pixel are compared, correlated, or undergo a Boolean operation (e.g., by corresponding circuit elements), in order to generate desired information. For example, a correlation between respective times of arrival indicated by the respective electrical signals may be performed. In some embodiments, one or more of the photodiodes in a pixel can be disabled, either globally, or on a per-pixel basis, either statically (e.g., at a given time) or dynamically (e.g., in response to changes in the FoV and/or in response to a control signal (for example, as provided by the control circuits 605 described herein)). The control signal may be generated in response to the signal levels received by the pixel. For example, responsive to initial detection of a relatively strong signal from a target, three of the four SPADs defining a pixel may be deactivated so that power consumption of the pixel is reduced.

FIG. 1A is a cross-sectional view illustrating an optoelectronic device or structure in the form of a photodetector device according to some embodiments of the present invention. As shown in FIG. 1A, the photodetector device 100*a* includes a semiconductor material layer or sensor wafer 101 having one or more photodiodes 105 therein. For example, the semiconductor material layer 101 may include silicon (or other semiconductor) material having an incident light surface. First and second regions may be formed in the semiconductor material layer 101 (e.g., by doping) to define a semiconductive junction (e.g., a p-n junction) 105*n*/105*p* of the photodiode 105. In some embodiments, the semiconductor material layer 101 may have a thickness of from about 1 μm to about 100 μm. The photodiode 105 may have a surface area of from about 0.1 μm$^2$ to about 1000 μm$^2$. The photodetector device 100*a* may represent a portion (e.g., a pixel structure, also referred to as a pixel) of an optical sensor array including a plurality of imaging pixels.

The photodiode 105 may be a Geiger-mode photodiode, such as a single-photon avalanche detector (SPAD), that is configured to be biased beyond the breakdown voltage thereof to generate an electrical signal responsive to detection of incident electromagnetic radiation, illustrated as incident photons 10, with the electrical signal generated by the photodiode 105 being independent of the optical power of the incident photons 10. That is, the photodetector device 100*a* has a binary responsivity independent of the impinging optical power of the electromagnetic radiation 10. In some embodiments, the photodiode 105 may be configured (e.g., by including wavelength selective filter(s) in the path of the incident photons 10) to detect electromagnetic radiation having at least one wavelength in a range of from about 800 nanometers (nm) to about 1200 nm. The photodiode 105 also includes a guard ring structure 105*g* to control the avalanche process, and a textured region 115 coupled to the semiconductor material layer 101. The drawn (P-) guard ring 105*g* is for illustrative purposes only and can be replaced with many others as are known in the art without loss of generality.

The textured region 115 includes optical structures that are positioned to interact with the incident photons 10 in the detection by the photodiode 105. For example, the textured region 115 may include a surface having a topology with nano- to micron-sized surface variations. The characteristics of the textured region 115 can vary depending on the materials and techniques employed. In some embodiments, the textured region 115 may be several hundred nanometers thick and made up of nanocrystallites (e.g., from about 10 nm to about 50 nm) and nanopores. In some embodiments, the textured region 115 may include micron-sized structures (e.g., about 1 μm to about 60 μm). In some embodiments, the textured region 115 *a* may include nano-sized and/or micron-sized structures from about 5 nm to about 10 μm.

In some embodiments, the textured region 115 may be formed in a surface of the semiconductor material layer 101. For example, the textured region 115 may be formed in the back surface or backside 101b of the sensor wafer or semiconductor material layer 101 having the photodiode 105 therein, using one or more laser beams with sufficient energy to texturize the surface of the semiconductor material layer 101. As another example, texturing of the back surface 101b of the semiconductor material layer 101 may be performed using a reactive chemical solution to form the textured region 115.

The textured region 115 is configured to increase the probability of absorption of the incident photons 10 by the photodiode(s) 105 in semiconductor material layer 101, in particular, by increasing the optical path length of the incident photons 10 in the semiconductor material layer 101. That is, for photons 10 that are incident on the surface 101b, the textured region 115 is configured to increase the path that is traveled by the photons 10 within the wafer 101 before detection by the photodiode 105 (as compared to the distance that a photon travels directly from the surface 101b to the underlying photodiode 105), where the longer optical path length can increase the probability of absorption of the photons 10 and thus the sensitivity of the device 100a. For example, the probability of absorption of long-wavelength photons (e.g., about 800 nm to about 1200 nm) that may be used by emitter(s) of a time-of-flight based measurement system may be increased. Although illustrated as positioned between the photodiode 105 and the source of the electromagnetic radiation 10, will be understood that the textured region 115 may be positioned on opposite side of the semiconductor material layer 101 from the source of the incident photons 10 (e.g., with the photodiode 105 between the textured region 115 a and the source of the incident photons 10) in some embodiments. More generally, the textured region 115 may be provided in one or more surfaces or areas of the semiconductor material layer 101 so as to interact with the detection of incident photons 10 by one or more photodiodes 105 in the semiconductor material layer 101.

Still referring to FIG. 1A, the photodetector device 100a may further include first and second electrodes 107n, 107p. The electrodes 107n, 107p are configured to bias the photodiode 105 beyond the breakdown voltage thereof based on a voltage difference between the electrodes 107n, 107p. In particular, the electrodes 107n, 107p may define an anode and cathode of the photodiode 105, and a reverse bias voltage may be applied across the electrodes 107n, 107p. The reverse bias voltage may be from about 10 V to about 200 V in some embodiments. The voltage difference between the electrodes 107n, 107p defines an electric field gradient that pulls charges generated in response to the detection of the incident photons 10 to depletion region in order to create the avalanche condition in the photodiode 105. In some embodiments, the voltage difference between the electrodes 107n, 107p may be switched between a first voltage that is greater than the breakdown voltage of the photodiode 105, and a second voltage that is less than the breakdown voltage of the photodiode 105. The electrodes 107n, 107p defining the anode and cathode of the photodiode 105 may be connected to a quenching and/or recharge circuit in some embodiments.

In some embodiments, a backside electrode 107b may be provided on or surrounding the textured region 115. Additional electrodes 107e may be provided extending adjacent and/or along the isolation regions 110 in some embodiments. The electrodes 107b, 107e may be configured to confine the photogenerated charges to the pixel area to reduce crosstalk. Isolation regions (illustrated by way of example as deep trench isolation (DTI) structures or regions 110) may be filled with a dielectric material (such as $SiO_2$) and passivated, for example, with a highly doped semiconductor material, so as to avoid formation of defects in the semiconductor material layer 101. In some embodiments, the semiconductor material layer 101 may be a crystalline silicon substrate.

The photodiode 105 may include a guard ring structure 105g for more uniform avalanche breakdown. In some embodiments, the photodiode 105 may include a substantially planar semiconductive junction 105n/105p and a guard ring structure 105g at edges or along a periphery of the junction 105n/105p, such that the electrical field formed when the junction 105n/105p is reverse-biased is sufficiently uniform. As such, upon avalanche breakdown, a majority of the avalanche current may flow within the planar region of the junction 105n/105p rather than at the edges or corners of the junction 105n/105p. While illustrated herein primarily with reference to a diffuse P-type guard ring 105g surrounding a p-n junction 105n/105p formed in P-type substrate 105p as the semiconductor material layer 101, it will be understood that embodiments of the present invention may include photodetector devices of the opposite conductivity types (e.g., an N-type substrate as the semiconductor material layer with a diffuse n-type guard ring surrounding the p-n junction) and/or other photodiode types.

Figure 1B:
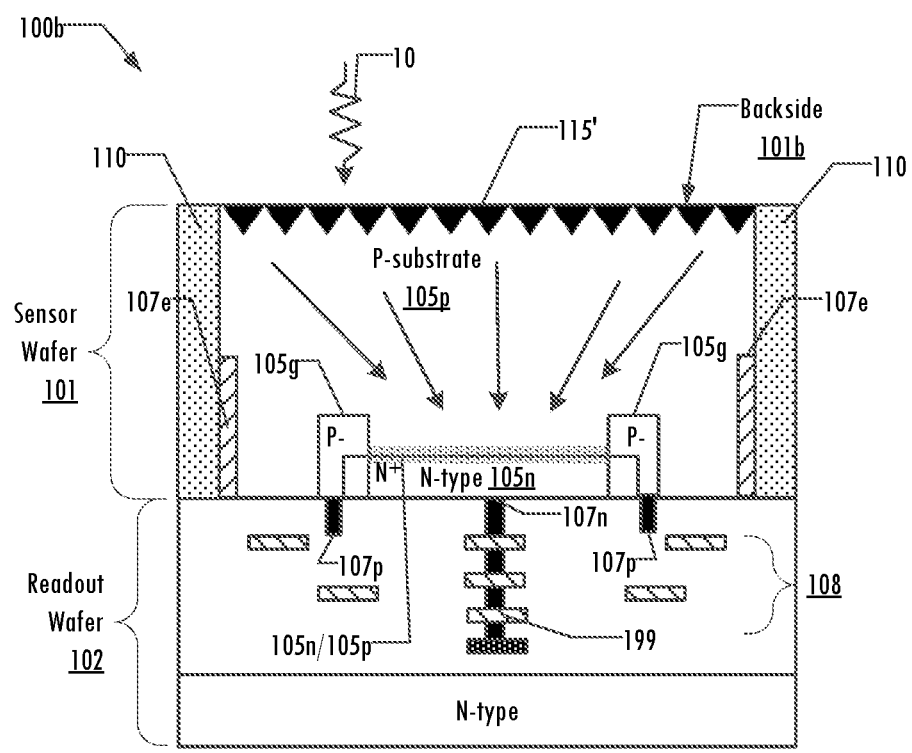
Figure 1C:
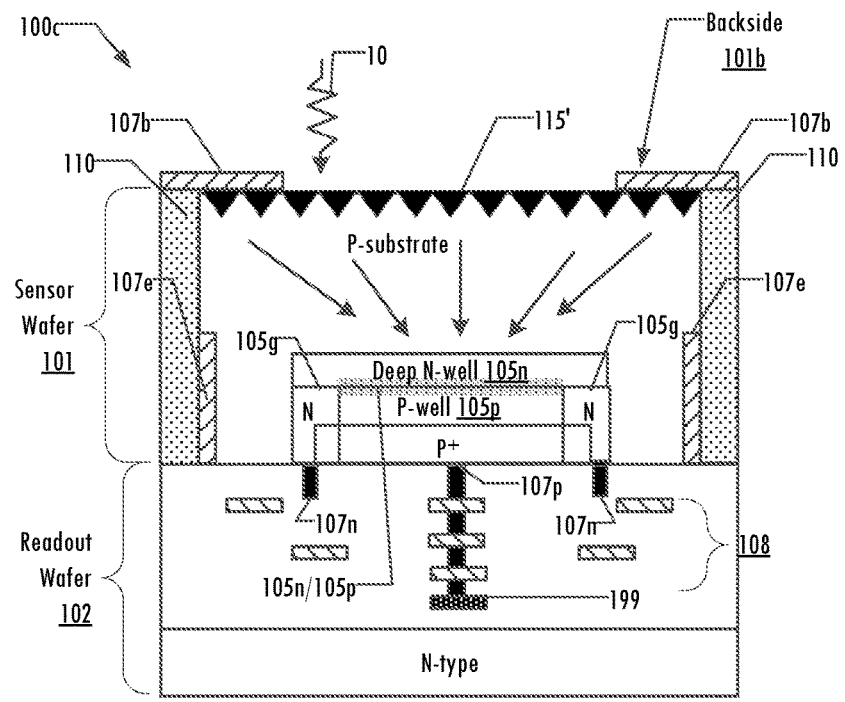

FIGS. 1B and 1C are cross-sectional views illustrating photodetector devices 100b, 100c according to some embodiments of the present invention. As shown in FIGS. 1B and 1C, the photodetector devices 100b, 100c include an arrangement of a semiconductor material layer or sensor wafer 101 including an individual Geiger-mode photodiode 105 with a guard ring structure 105g. The photodiode 105 is separated from other Geiger-mode photodiodes in the semiconductor material layer 101 by isolation regions (illustrated by way of example as deep trench isolation (DTI) structures or regions 110). The isolation regions may define a barrier that is formed between adjacent photodiodes 105, thereby providing boundaries for respective pixel structures. This barrier may, without loss of generality be in the form of a trench, a passivated trench, a filled trench, a filled passivated trench, an electrical field defined by electrodes on the front surface of the wafer (e.g., a wafer of silicon material), an electrical field defined by electrodes on the back surface of the wafer, an electrical field defined by electrodes on or in the trenches, and electric field defined by charged Through-Silicon Vias.

In FIGS. 1B and 1C, the isolation regions in the form of DTI regions 110 surround the photodiode 105 in the sensor wafer 101. The DTI regions 110 define boundaries for a pixel defined by the photodiode 105. In FIG. 1B, electrodes 107e extend along the DTI regions 110 at opposite sides of the photodiode 105. In FIG. 1C, a backside electrode 107b also extends along the DTI regions 110 and along the optical structures 115' above the photodiode 105. The electrodes 107n, 107p, 107b, 107e may be formed of a material (such as indium tin oxide (ITO)) that is substantially transparent to photons 10 of the wavelength ranges corresponding to the optical signals to be detected. Such transparent electrodes 107n, 107p, 107b, 107e may extend across a majority or an entirety of the optical structures 115' in some embodiments. In some embodiments, due to the relatively high electric fields that may be present in Geiger-mode photodiodes 105, passivation may be applied to the DTI regions 110, such that discontinuities in the crystalline structure of the semiconductor material layer 101 (e.g., silicon) do not inject charges to the high electric field regions and result in high dark count rate.

Textured regions including optical structures 115' are positioned on a light-receiving surface of the photodetector devices 100b, 100c between the photodiode 105 and a source of incident photons 10 to interact with and increase the probability of absorption of the incident photons 10 by the photodiode 105 in semiconductor material layer 101. As similarly discussed above with reference to FIG. 1A, the optical structures 115' are configured to increase the probability of absorption of the incident photons 10 by the photodiode 105, in particular, by increasing the optical path length of the incident photons 10 in the semiconductor material layer 101. In FIGS. 1B and 1C, the optical structures 115' are diffractive elements, illustrated as inverted pyramidal array (IPA) structures protruding from a backside 101b of the sensor wafer 101 toward the photodiode 105. The diffractive elements 115' may each include one or more dimensions that are smaller than a wavelength of the incident photons 20. In some embodiments, the diffractive elements 115' may be configured to refract the incident photons 10 at angles such that the incident photons 10 undergo total internal reflection from the respective isolation regions 110.

As shown in FIGS. 1A, 1B, and 1C, the sensor wafer 101 may be bonded to or otherwise stacked on a surface of a readout wafer 102. The readout wafer 102 includes metallization 108 and electronic circuit elements that are coupled to the photodiode 105 to provide a processing path 199 for the electrical signals generated by the photodiode 105 in response to the incident photons 10, also referred to herein as detection signals. In some embodiments, the electronic circuit elements of the readout wafer 102 may include an active and/or passive quenching and/or recharge circuit for each photodiode 105, such as described for example in U.S. Patent Application Publication No. 2019/0250257 entitled "Methods and Systems for High-Resolution Long Range Flash Lidar," the disclosure of which is incorporated by reference herein. The readout wafer 102 may further include a controller, timing, and/or correlation circuitry (e.g., as discussed with reference to FIGS. 6A and 6B) configured to perform ToF measurement operations as described herein.

Further embodiments of the present invention are directed to photodetector devices and optical sensor arrays whereby the isolation regions extend between or surround multiple photodiodes. These multiple photodiodes may be activated together, or only partially such that a subset of the photodiodes are activated. For example, in response to detecting a relatively strong signal from a target, only one of the four SPADs defining a pixel may be activated so that power consumption of the pixel is reduced by 75%. These multiple photodiodes may be read separately, i.e., their outputs can be sampled using respective electronic devices and/or circuit paths that are not shared by some or all of the other photodiodes between the isolation regions. The group or set of photodiodes between isolation regions may define a pixel that creates a single element of an image, where the image may refer to the collective output of the array of pixels, and can encompass any output, for example the photon flux, photon polarization, photon time of arrival, etc. Thus, photons impinging on optical structures (e.g., IPAs) anywhere on, in, or above the pixel structure may be absorbed anywhere in the pixel volume by any of the photodiodes, and the generated charges may be collected and output by any of the photodiodes in the pixel, so as to spatially "mix" the incident photons for more uniform sampling of a field of view imaged thereby. That is, the two or more photodiodes and/or the diffractive optical elements of each pixel are configured to distribute the incident flux across multiple photodiodes, which can reduce or avoid saturation of any one of the photodiodes of a pixel, thereby increasing dynamic range.

In contrast, when using some conventional optics, such as a macrolens outside the die and microlenses on top of a wafer (that is, optics without diffractive light structures), the probability of absorption is typically non-uniform and is typically increased or maximized in one spot in a pixel. This may be undesirable in the case of a pixel with multiple photodiodes, such as in correlation-detection pixels, because the probability of absorption may not be equalized across the photodiodes. If using one microlens per photodiode, the volume being sensed per photodiode may not fully overlap with that of the correlating photodiode and thus true correlation of photon arrivals from an object may not be achieved. Also, some conventional devices using IPA structures may include DTI regions between photodiodes that are reverse biased at a lower voltage than the breakdown voltage of the junction, in order to confine the reflected photons from being absorbed in adjacent photodiodes. These DTI regions typically extend all the way from the surface of the silicon to the back side such that any photogenerated charges will typically diffuse and be collected only by the photodiode below their absorption region.

Figure 2A:
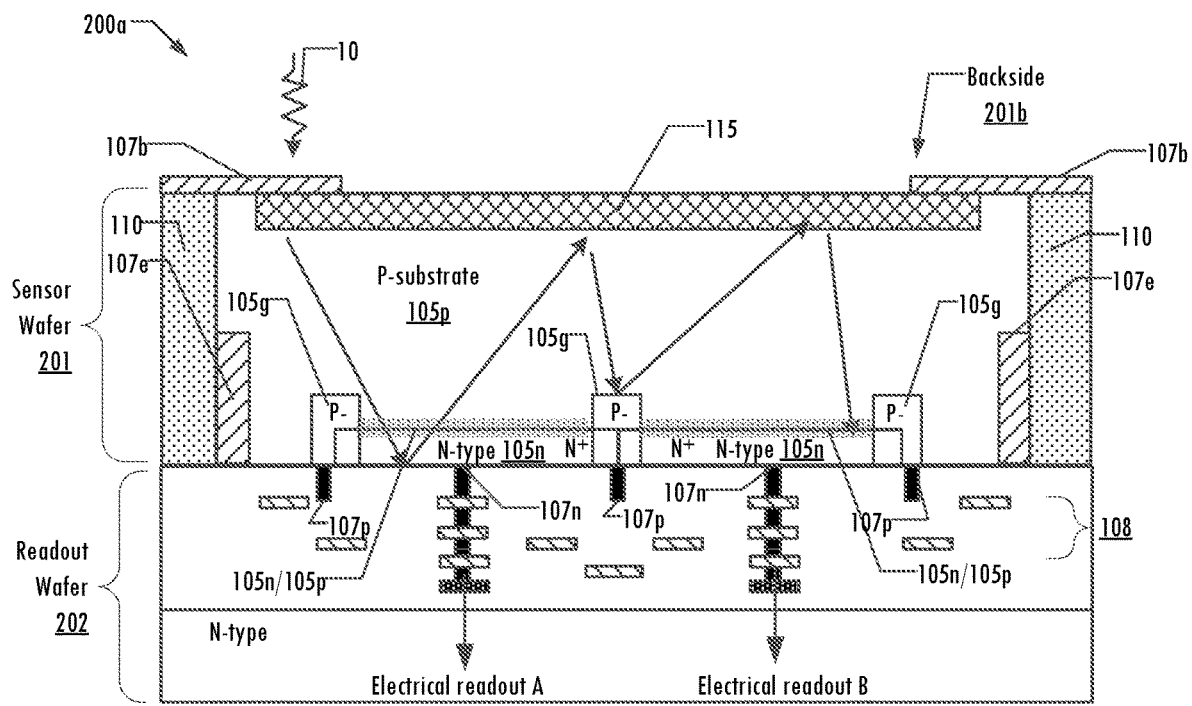
FIGS. 2A and 2B are cross-sectional views illustrating example photodetector devices including multiple photodiodes per pixel according to some embodiments of the present invention.
Figure 2B:
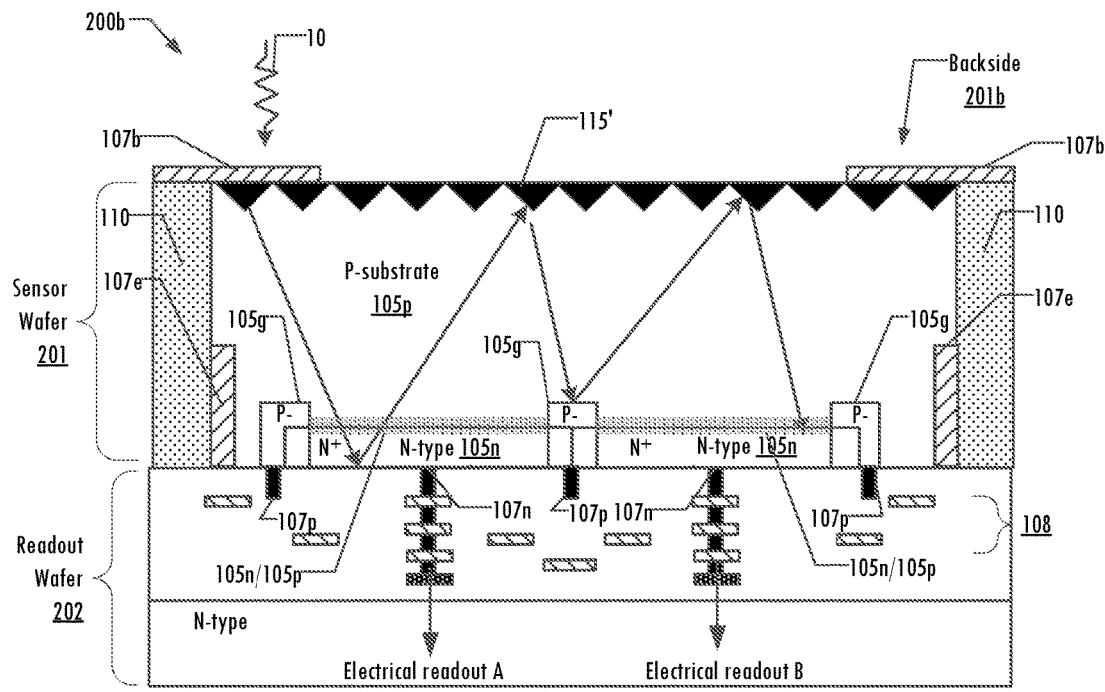

FIGS. 2A and 2B are cross-sectional views illustrating example photodetector devices including multiple photodiodes between isolation regions, with each of the photodiodes providing respective electrical outputs for readout via respective electronic circuits in accordance with some embodiments of the present invention. As shown in FIGS. 2A and 2B, the photodetector devices 200a, 200b include a semiconductor material layer or sensor wafer 201 having two or more photodiodes 105a, 105b therein. Each of the photodiodes 105a, 105b may include first and second regions that define a semiconductive junction (e.g., a p-n junction) 105n/105p. The photodiodes 105a, 105b include guard ring structures 105g for more uniform avalanche breakdown, where each of the photodiodes may include a substantially planar semiconductive junction 105n/105p with the guard ring structure 105g at edges or along a periphery of the junction 105n/105p. In the examples of FIGS. 2A-2C, a common guard ring structure 105g extends around multiple photodiodes 105a, 105b, but embodiments of the present invention are not limited thereto and each photodiode 105a and 105b may include a respective guard ring 105g in some embodiments. The photodiodes 105a, 105b may be Geiger-mode photodiodes, such as SPADs, which are each configured to be biased beyond the breakdown voltage thereof to generate an electrical signal responsive to detection of incident photons 10. The photodetector devices 200a, 200b may each represent a portion (e.g., a pixel) of an optical sensor array including a plurality of imaging pixels, with the two or more photodiodes 105a, 105b defining each pixel.

The photodetector devices 200a, 200b of FIGS. 2A and 2B further include isolation regions separating the two or more photodiodes 105a, 105b that define a pixel from neighboring pixels of the photodetector device. In the examples of FIGS. 2A and 2B, the isolation regions are illustrated as DTI regions 110, but it will be understood that embodiments of the present invention may include other barriers as isolation regions between adjacent pixels. In some embodiments, the DTI regions 110 extend from a surface adjacent the photodiodes 105a, 105b to a surface (illustrated as the backside 201b) of the semiconductor material layer 201, thereby providing substantial and/or complete isolation between neighboring pixels. The two or more photodiodes 105a, 105b of each pixel are free of respective DTI regions 110 therebetween, allowing for detection of the incident photons 10 by any of the multiple photodiodes 105a, 105b in each pixel. For example, the photodiodes 105a, 105b may be implemented by respective SPADs, with each pixel defining a compound SPAD structure (e.g., a quad-SPAD array in each pixel, with only two of the SPADs 105a and 105b shown in the cross-section of FIGS. 2A-2C). This arrangement provides multiple photodiodes 105, 105b that sample the same angular region of a field of view, with each of the photodiodes 105a, 105b sampling a respective angular sub-portion of the angular region without isolation from others of the photodiodes 105a, 105b.

The photodetector devices 200a, 200b may further include optical structures 115, 115' that are configured to direct the incident photons 10 to any of the two or more photodiodes 105a, 105b in each of the pixels, rather than to a particular photodiode. The optical structures 115, 115' are positioned between the photodiodes 105a, 105b and a source of the incident photons 10 by way of example. In FIG. 2A, a textured region (e.g., a textured surface of the semiconductor material layer of the sensor wafer 201) provides the optical structures 115, while in FIG. 2B, the optical structures 115' are implemented as an array of diffractive elements (illustrated as IPA structures protruding toward the two or more photodiodes 105a, 105b of each pixel).

The optical structures 115, 115' may have various sizes and shapes as described herein, and may include respective elements (e.g., respective pyramid-shaped structures of the IPA) with one or more dimensions that are smaller than a wavelength of the incident photons 10 in some embodiments. For example, the diffractive elements 115' may be configured to refract the incident photons 10 at angles such that the incident photons 10 undergo total internal reflection from the respective isolation regions 110. The optical structures 115, 115' are configured to increase the path that is traveled by the photons 10 within the volume of the pixel before detection by one of the photodiodes 105a or 105b of the pixel (as compared to the distance that a photon travels directly from the surface 201b to the underlying photodiode 105a or 105b), e.g., by directing the photons 10 away from (a closer) one of the photodiodes 105a and toward another (farther one) of the photodiodes 105b. More generally, the optical structures 115, 115' are configured to increase the optical path lengths (and thus the absorption or detection probability) of the incident photons 10 in the photodetector devices 200a, 200b relative to the distance that incident light normal to a surface (e.g., the backside 201b) would travel to reach a directly underlying photodiode 105a or 105b (e.g., a distance corresponding to the thickness of the wafer 201) of the photodetector devices 200a, 200b.

The arrangement of the isolation regions 110 to define groups of multiple photodiodes 105a, 105b in each pixel, and/or the arrangement of the optical structures 115, 115' to direct incident photons 10 to any of the multiple photodiodes 105a, 105b in each pixel, can provide photon mixing structures for more uniform imaging (also referred to herein as sampling) of a field of view. For example, as shown by the arrows in FIGS. 2A and 2B, the isolation regions 110 and/or the optical structures 115, 115' are configured to increase optical path lengths of and spatially mix the photons 10 that are incident on the left and right photodiodes 105a and 105b, e.g., by directing photons 10 to be reflected from the isolation regions 110 and/or other reflective surfaces therebetween within each pixel. In particular, as shown by the arrows in FIGS. 2A and 2B, photons 10 incident on the backside 201b above the left photodiode 105a may be redirected away from the closest photodiode 105a by the optical structures 115, 115' and reflected from an opposite surface of the sensor wafer 201 and/or surfaces of the guard rings 105g multiple times before absorption by the right photodiode 105b.

The photodiodes 105a and 105b are each oriented to sample respective sub portions of a field of view of the pixel (e.g., respective sub portions of a 1° field of view of the pixel). In other words, each photodiode 105a, 105b is positioned to sample a respective angular sub-region of the angular region imaged by the pixel, and the photon mixing structures defined by the isolation regions 110 and/or the optical structures 115, 115' are configured to distribute incident flux 10 across multiple photodiodes 105a, 105b of each pixel to provide more uniform sampling of the angular region imaged by the pixel, at the expense of spatial resolution. The photodetector devices 200a, 200b are thus configured to generate respective electrical signals responsive to the detection of the incident photons 10 by any of the two or more photodiodes 105a, 105b in each pixel, and the photon mixing structures can avoid (or reduce the likelihood of) saturation of any one of the photodiodes 105a, 105b, thereby increasing the dynamic range of the photodetector devices 200a, 200b.

Still referring to FIGS. 2A and 2B, the photodetector devices 200a, 200b may include first and second electrodes 107n, 107p that are configured to bias each of the photodiode 105a, 105b beyond their respective breakdown voltages based on a voltage difference between the electrodes. The electrodes 107n, 107p may define respective anodes and cathodes of each of the photodiodes 105a, 105b in a pixel, such that different subsets or subgroups of the photodiodes 105a, 105b in each pixel can be individually activated or deactivated for detection of the incident photons. In some embodiments, the voltage difference between the electrodes 107n, 107p may be switchable between a first voltage that is greater than a respective breakdown voltage to activate a respective photodiode 105a and/or 105b, and a second voltage that is less than the respective breakdown voltage to deactivate a respective photodiode 105a and/or 105b. For example, responsive to detection of incident photons by multiple of the photodiodes 105a and 105b of a pixel, a subset of the photodiodes 105a and 105b may be deactivated to reduce power consumption.

Each photodiode 105a, 105b of a pixel may be configured to output a respective electrical signal Readout A, Readout B to respective processing paths (e.g., as provided by a readout circuit) responsive to detection of incident photons 10. The readout circuit may be provided on the sensor wafer 201 or on a different substrate (e.g., on a readout wafer 202, 302, 402, 502 as described herein). The respective processing paths may include respective electronic circuit elements that are not shared by the two or more photodiodes 105a, 105b of each of the pixels.

In some embodiments, the readout circuit may include a correlator or controller circuit that is configured to distinguish incident photons corresponding to optical signals output from a time of flight measurement system (e.g., a lidar emitter array) from ambient light based on respective times of arrival of two or more photons within a predetermined correlation time relative to one another. Such correlator circuits are described, for example, in U.S. Patent Application Publication No. 2019/0250257 entitled "Methods and Systems for High-Resolution Long Range Flash Lidar," which is incorporated by reference herein. The respective electrical signals Readout A, Readout B generated by the photodiodes 105a, 105b may be output to a readout circuit (e.g., as provided in a readout wafer 202, 302, 402, 502) via respective transmission paths. The readout circuit may be configured to perform temporal and/or spectral correlation between the respective electrical signals Readout A, Readout B output in response to the incident photons 10, based on the relative times of arrival (temporal correlation) and/or respective wavelengths (spectral correlation) of the photons 10.

For example, in operating a LIDAR system in ambient light conditions, a SPAD-based photodetector device or optical sensor array may have difficulty distinguishing between photons from ambient light (also referred to as background photons) and photons from the optical signals output by the lidar emitter(s) (also referred to as signal photons). The readout circuit may include a correlator and a photon counter or time integrator with respective inputs for the electrical signals Readout A and Readout B generated by the photodiode 105a and 105b, respectively, responsive to detecting the incident photons 10, which may be configured to selectively count photons based on a time correlation between their respective times of arrival (also referred to as coincidence or correlation-detection), which can reduce the quantity of incoming photons that are processed. For example, based on recognition that photons originating from a pulsed LIDAR emitter (e.g., a laser) and reflected by a target may arrive in a relatively narrow window of time or correlation window, the readout circuit can selectively utilize some of the electrical signals Readout A and Readout B that are received within the correlation window in ToF measurement calculations, while rejecting or discarding others of the electrical signals Readout A and Readout B that fall outside the correlation window as resulting from uncorrelated photons originating from ambient light sources (e.g., the sun). Such temporal correlation operations can increase the signal-to-background ratio of the photodetector devices 200a, 200b in high ambient light conditions.

In some embodiments, a shallower trench isolation (SrTI) structure can be provided between the two more photodiodes 105a, 105b in each pixel. An example structure illustrating multiple photodiodes between DTI regions with a SrTI structure between adjacent photodiodes of a pixel is shown in FIG. 3.

Figure 3:
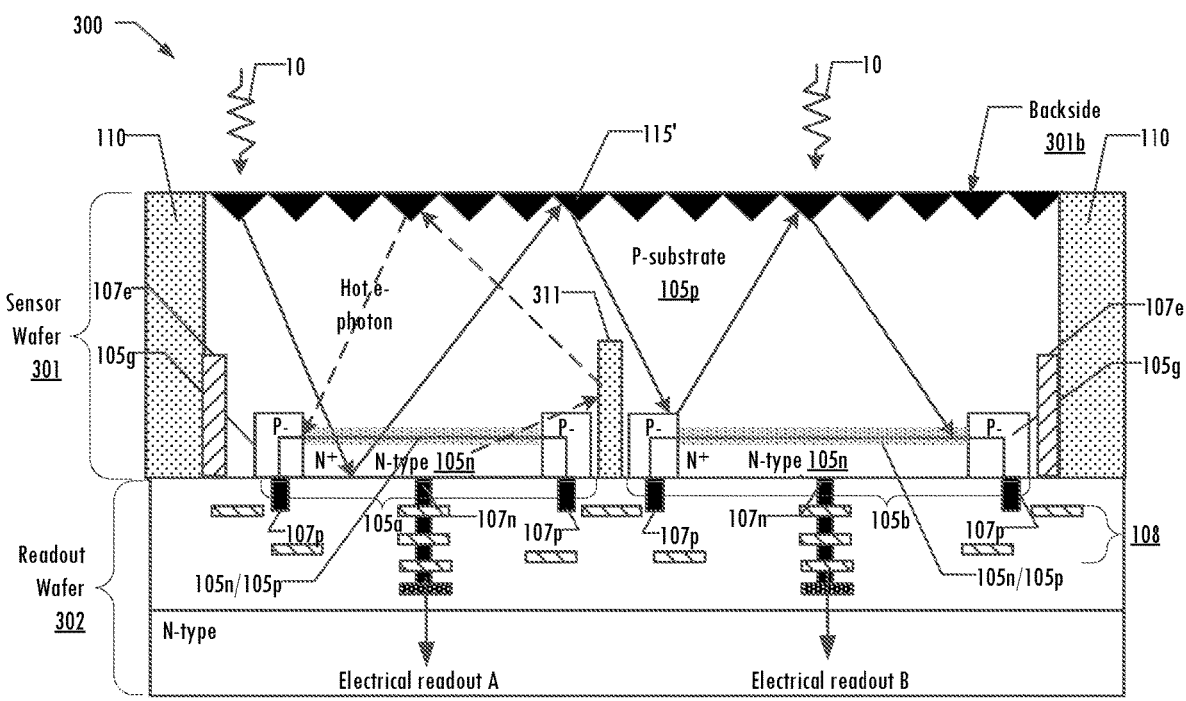
FIG. 3 is a cross-sectional view illustrating an example photodetector device including shallow isolation structures between the multiple photodiodes of each pixel in accordance with some embodiments of the present invention.

FIG. 3 is a cross-sectional view illustrating an example photodetector device including SrTI structures between the multiple photodiodes of each pixel, with each of the photodiodes providing respective electrical outputs for readout via respective electronic circuits in accordance with some embodiments of the present invention. As shown in FIG. 3, a photodetector device 300 includes a semiconductor layer or sensor wafer 301. The sensor wafer 301 may include elements similar or corresponding to the sensor wafer 201 of FIG. 2, including two or more photodiodes 105a, 105b defining one pixel of a plurality of pixels, isolation regions 110 separating the photodiodes 105a, 105b from neighboring pixels, and optical structures 115' that are configured to direct incident photons 10 to any of the two or more photodiodes 105a, 105b in each of the pixels, rather than to a particular photodiode. The sensor wafer 301 further includes shallower trench isolation (SrTI) structure 311 formed between the two photodiodes 105a, 105b of the pixel. The SrTI structure 311 is shallower than the DTI regions 110 at the boundaries of each pixel. That is, the respective DTI regions 110 protrude away from the photodiodes 105a, 105b towards a light-receiving surface (illustrated as a backside 301b) beyond (i.e., higher or taller than) the SrTI structure 311.

In the example of FIG. 3, each photodiode 105a and 105b includes a respective guard ring structure 105g, with the SrTI structure 311 between the respective guard ring structures 105g. The SrTI structure 311 has a height or depth that is sufficient to allow for the increased optical path lengths of the incident photons 10 (shown by solid arrows in FIG. 3) within the pixel defined by the photodetector device 300, but is sufficient to reduce the probability of absorption of hot-e-generated secondary photons (shown by dotted arrows in FIG. 3) in one of the photodiodes 105a, 105b from reaching a region above others of the photodiodes 105a, 105b. For example, when an avalanche flows through a junction 105n/105p of a first photodiode 105a, hot electrons may recombine, resulting in re-emission of secondary "hot-e" photons in the process. These hot-e photons may induce secondary, correlated avalanches in the adjacent photodiode(s) 105b of the pixel, which may be undesirable. As such, the SrTI structure 311 is shallower than the DTI regions 110 to allow the distribution of signal photons 10 across the multiple photodiodes 105a, 105b in a pixel, but is sufficiently deep to reduce the probability of hot-e-generated secondary photons from reaching the region above an adjacent or neighboring photodiode 105a or 105b between the same DTI regions 110, thus reducing the probability for optical crosstalk between the photodiodes 105a, 105b in a pixel.

In some embodiments, the SrTI structure 311 may protrude away from the junctions 105n/105p and beyond the respective guard ring structures 105g of the photodiodes 105a, 105b, towards a light-receiving surface (illustrated as a backside 301b), and the DTI regions 110 may protrude beyond the SrTI structure 311. That is, the SrTI structure 311 is higher or taller than the guard ring structures 105g, and the DTI regions 110 are higher or taller than the SrTI structure 311. The SrTI structure 311 may be formed of an insulating material having a greater breakdown strength than the material of the sensor wafer 301, allowing for closer lateral placement of the photodiodes 105a, 105b with less electric field interference therebetween. For example, sensor wafer 301 may be silicon (Si)-based, and the SrTI structure 311 may be silicon dioxide ($SiO_2$), with a breakdown strength approximately 10 times greater than Si. In some embodiments, the SrTI structure 311 may be formed of a same or similar material as the DTI regions 110.

Figure 4:
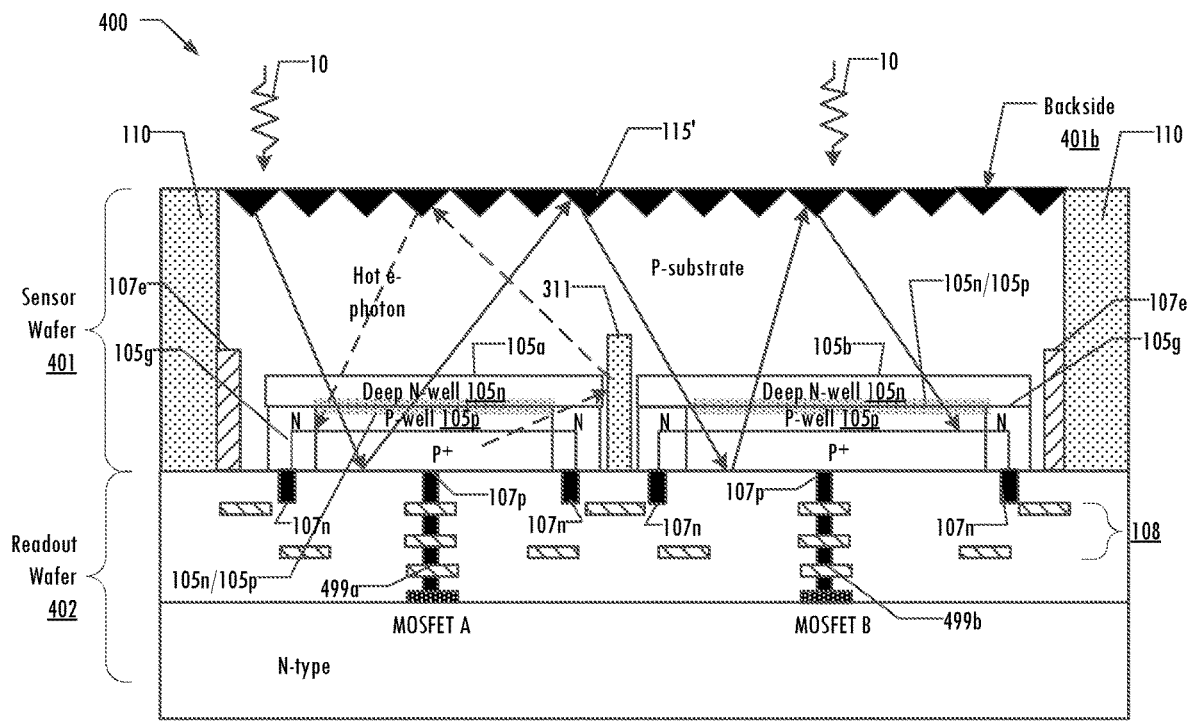
FIG. 4 is a cross-sectional view illustrating an example photodetector device stacked on a readout wafer in accordance with some embodiments of the present invention.

FIG. 4 is a cross-sectional view illustrating an example photodetector device in accordance with some embodiments of the present invention. As shown in FIG. 4, the photodetector device 400 includes a stacked structure with a sensor wafer 401 on a readout wafer 402. The sensor wafer 401 may include elements similar or corresponding to the sensor wafer 301 of FIG. 3, including two or more photodiodes 105a, 105b defining one pixel of a plurality of pixels, isolation regions 110 separating the photodiodes 105a, 105b from neighboring pixels, optical structures 115' that are configured to direct incident photons 10 to any of the two or more photodiodes 105a, 105b in each of the pixels, rather than to a particular photodiode, and a SrTI structure 311 between the two photodiodes 105a, 105b of the pixel.

In the photodetector device 400, the sensor wafer 401 is bonded to a surface of the readout wafer 402. The readout wafer 402 includes respective electrical processing paths 499a, 499b for the respective electrical signal outputs Readout A, Readout B of the photodiodes 105a, 105b. The respective processing paths 499a, 499b of the readout wafer 402 may include respective electronic circuit elements that are not shared by the photodiodes 105*a*, 105*b* of the pixel. In particular, the processing path 499*a* may provide the electrical signal Readout A output from photodiode 105*a* to a transistor (illustrated as MOSFET A) of the underlying readout wafer 402, while the processing path 499*b* may separately provide the electrical signal Readout B output from photodiode 105*b* to a transistor (illustrated as MOSFET B) of the underlying readout wafer 402. As noted above, the respective processing paths 499*a*, 499*b* of the readout wafer 402 may include additional circuit elements that are not shared by the photodiodes 105*a*, 105*b* of the same pixel, such as active and/or passive quenching and/or recharge circuits. The readout wafer 402 may further include circuit elements that may be shared by the photodiodes 105*a*, 105*b* of a pixel, such as controller, timing, and/or correlation circuitry configured to perform ToF measurement operations as described herein.

Figure 5:
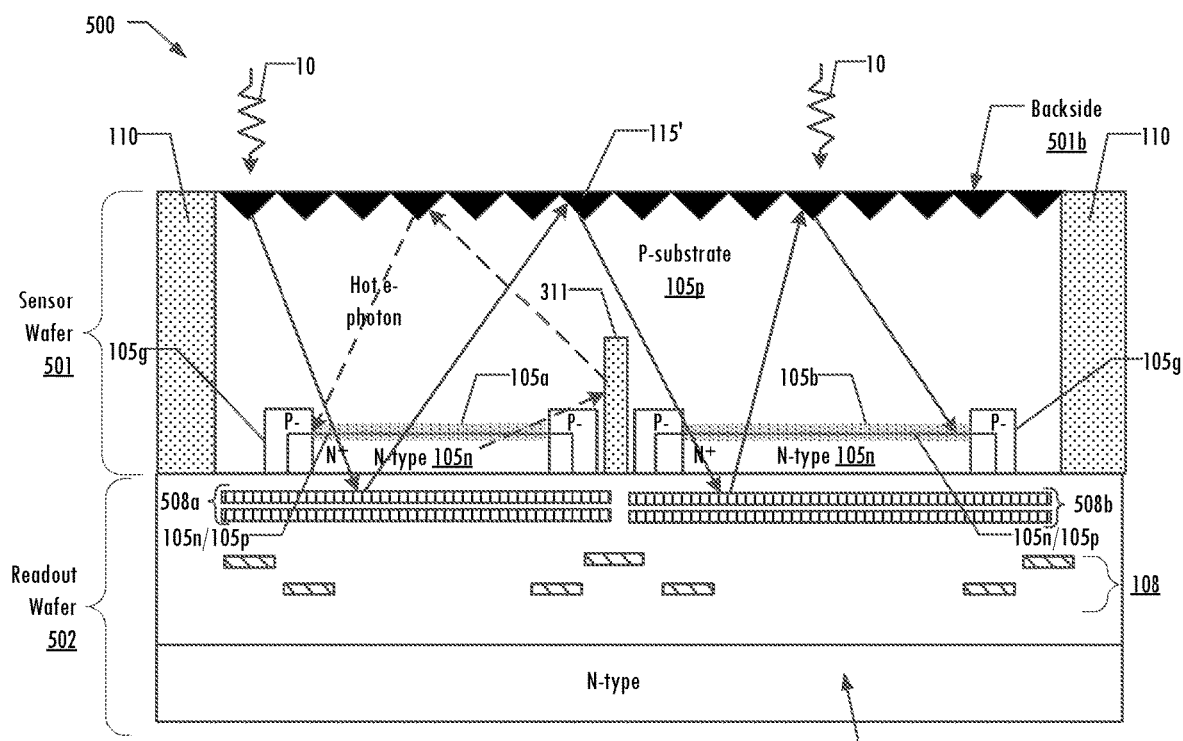
FIG. 5 is a cross-sectional view illustrating an example photodetector stacked on a readout wafer including capacitor structures in accordance with some embodiments of the present invention.

In some embodiments, one or more metal layers or structures are positioned adjacent a surface of the readout wafer that provides an interface with the sensor wafer. FIG. 5 is a cross-sectional view illustrating an example photodetector device in accordance with some embodiments of the present invention. As shown in FIG. 5, the photodetector device 500 includes a stacked structure with a sensor wafer 501 on a readout wafer 502. The sensor wafer 501 may include elements similar or corresponding to the sensor wafer 401 of FIG. 4, including two or more photodiodes 105*a*, 105*b* defining one pixel of a plurality of pixels, isolation regions 110 separating the photodiodes 105*a*, 105*b* from neighboring pixels, optical structures 115' that are configured to direct incident photons 10 to any of the two or more photodiodes 105*a*, 105*b* in each of the pixels, rather than to a particular photodiode, and a SrTI structure 311 between the two photodiodes 105*a*, 105*b* of the pixel.

In the photodetector device 500, the sensor wafer 501 is bonded to a surface of the readout wafer 502. The readout wafer 502 includes metal layers 508*a*, 508*b* adjacent the surface of the readout wafer 502 at the interface with the sensor wafer 501. As can be seen in the example structure 500 shown in FIG. 5, a pixel area or "cube" formed by the optical structures 115' and DTI regions 110 is open or relatively unobstructed on the front side 501*f* of the photodetector device 500, with the metal layers 508*a*, 508*b* provided between the photodiodes 105*a*, 105*b* and the front side 501*f*, such that the pixel area is in essence optically sealed. The metal layers 508*a*, 508*b* may be configured to provide electrical signals to or from the photodiodes 105*a*, 105*b* (e.g., to bias the devices 105*a*, 105*b*, or for carrying signals output therefrom).

The metal layers 508*a*, 508*b* may be configured to perform multiple functions or serve multiple purposes. Electrically, the metal layers 508*a*, 508*b* may function as capacitors to store charge in close vicinity to the photodiodes 105*a*, 105*b*. For example, the photodiodes 105*a*, 105*b* may be SPADs, which (in ToF applications) may have timing requirements on the order of nanoseconds (ns) or picoseconds (ps). As capacitance may affect recharge time, dark count rate, and/or after-pulsing of the photodiodes 105*a*, 105*b*, providing the metal layers 508*a*, 508*b* adjacent the interface with the sensor wafer 501 (and thus, in close proximity to respective photodiodes 105*a*, 105*b*) may provide relatively low inductance between the charge storage nodes defined by the metal layers 508*a*, 508*b* and the junctions 105*n*/105*p* of the photodiodes 105*a*, 105*b*, such that the capacitors 508*a*, 508*b* may be charged and discharged more quickly.

Additionally or alternatively, the metal layers 508*a*, 508*b* may be configured to function as capacitors as part of an analog time integrator or analog counter for correlated SPAD pixels. For example, the readout wafer 502 may include respective electronic circuit elements that define an analog time integrator or an analog counter, and the metal layers 508*a*, 508*b* may define integrating or counting capacitors of the analog time integrator or analog counter.

Additionally or alternatively, the metal layers 508*a*, 508*b* may include one or more surfaces that are configured to increase the optical path length of incident photons, that is, to reflect light back into the pixel area (shown by solid arrows in FIG. 5) and thus further increase the detection probability. That is, the metal layers 508*a*, 508*b* may include reflective surfaces that extend beneath the photodiodes 105*a*, 105*b* and are configured to provide respective charge storage nodes that reflect light into the pixel. In some embodiments, the metal layers 508*a*, 508*b* may be implemented as a Metal-Insulator-Metal (MiM) structures or Metal-Oxide-Metal (MoM) structures.

In some embodiments, the pitch of the isolation regions 110 defining each pixel may differ in different directions (e.g., horizontal and vertical) along the light receiving surface of the photodetector devices 100*a*, 100*b*, 100*c*, 200*a*, 200*b*, 300, 400, 500 or optical sensor arrays defined thereby. For example, the vertical pitch of the isolation regions 110 may be different than the horizontal pitch of the isolation regions 110. This can provide pixel structures which are asymmetrical across axes (e.g., in different directions along the light receiving surface of the optical sensor array, such as along the X- and Y-axes), spreading photons (in some instances, approximately uniformly) across the pixel structure without the use of optical elements such as aspherical lenses.

In some embodiments, the pixel structure of the photodetector devices 100*b*, 100*c*, 200*b*, 300, 400, 500 may further include the textured region 115 positioned to interact with the incident electromagnetic radiation 10 in combination with the diffractive elements 115'. For example, the textured region 115 may be provided as a layer or region of black silicon that is positioned adjacent a frontside of the photodetector devices 100*b*, 100*c*, 200*b*, 300, 400, 500, opposite the backside 101*b*, 201*b*, 301*b*, 401*b*, 501*b* including the diffractive elements 115' thereon. The black silicon region may be configured to reduce reflectivity and increase the wavelength range of light absorption by the photodiodes of each pixel.

More generally, embodiments described herein may use optical structures (including IPAs or other diffractive structures) to homogenize detection across multiple photodiodes that are included in one pixel, with DTI regions (or other isolation structures) separating the groups of photodiodes that define each pixel. The DTI regions and IPAs are arranged or otherwise configured to create a "photon mixer," which sends photons to various photodiodes in the pixel defined between the adjacent DTI regions, regardless of where in the field of view the photons came from.

Embodiments of the present invention may be used in optical sensor arrays, such as in detector arrays in ToF-based imaging applications. For example, flash LIDAR can use a pulsed light emitting array to emit light for short durations over a relatively large area to acquire images based on sensing of the reflected light emission, to provide solid-state imaging of a large field of view. A non-flash or scanning LIDAR system may generate image frames by scanning light emission over a field of view or scene, for example, using a point scan or line scan (e.g., emitted from a onedimensional (1D) emitter array) to emit the necessary power per point and sequentially scan to reconstruct the full FoV. A non-range-strobing LIDAR system may illuminate the whole range of interest and collect echoes from the whole range of interest. An indirect time-of-flight (iToF) LIDAR system may measure range by detecting a phase offset of an echo with reference to an emitted signal, whereas a direct time-of-flight (dToF) lidar measures range by detecting the time from emission of a pulse of light to its detection by a receiver. In specific applications, the sensing of the reflected light by photodetector devices may be performed using a detector array of Geiger-mode single-photon detectors, such as a SPAD detector array. SPAD detector arrays may be used as solid-state detectors in imaging applications where high sensitivity and timing resolution are desired.

Figure 6A:
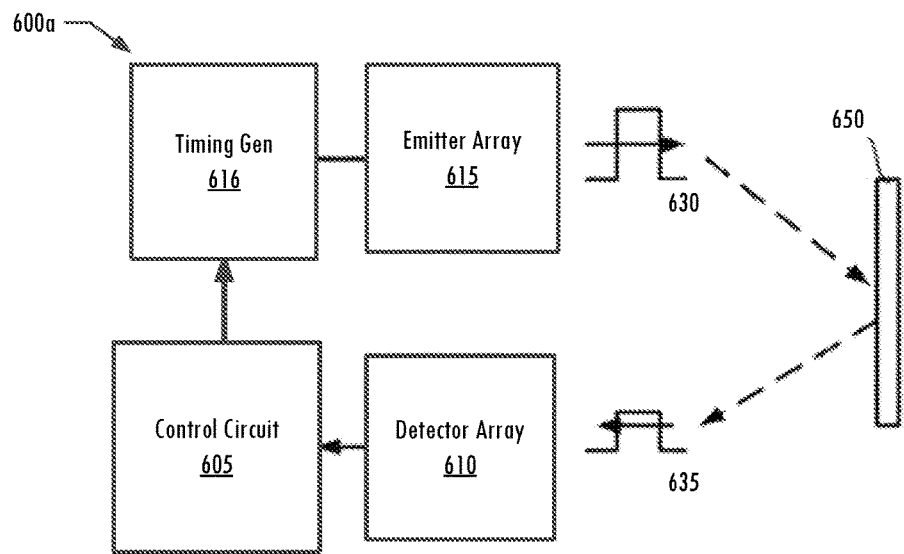
FIGS. 6A and 6B are block diagrams illustrating example lidar systems or circuits and related components in accordance with some embodiments of the present invention.
Figure 6B:
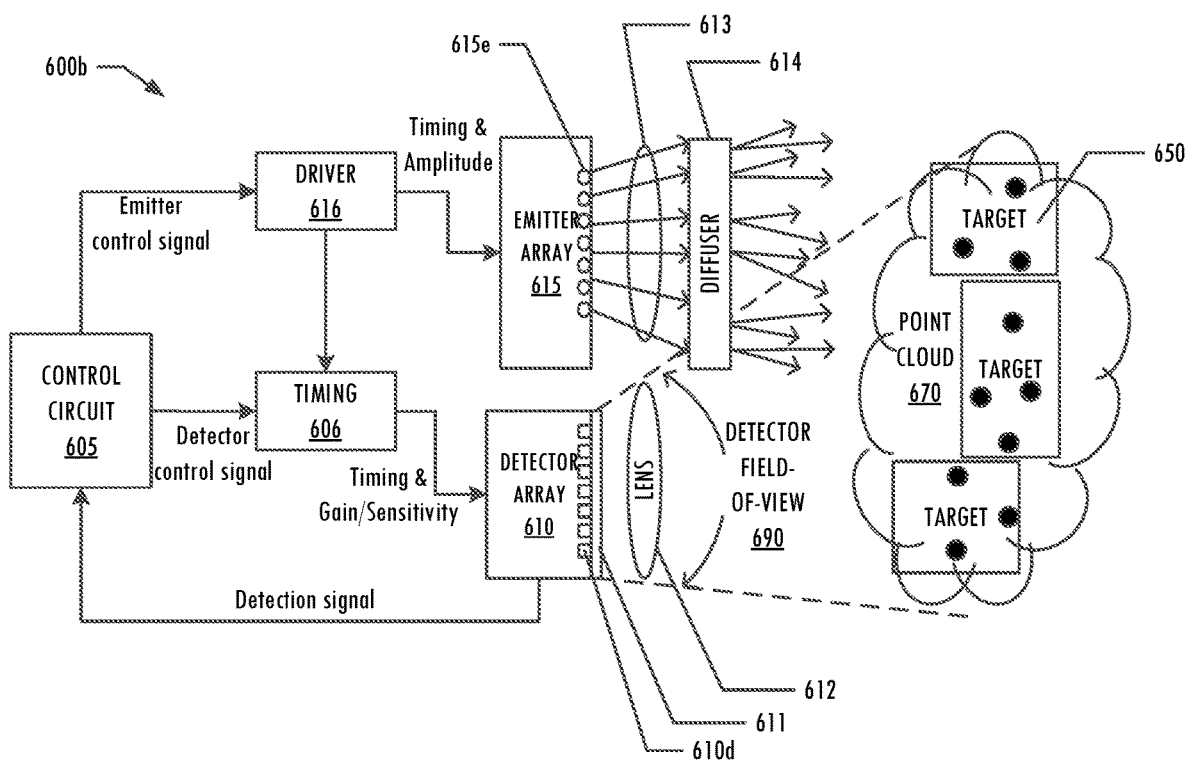

FIGS. 6A and 6B illustrate example time of flight measurement systems 600a and 600b and related components in lidar applications in accordance with some embodiments of the present invention. As shown in FIG. 6A, a lidar ToF circuit or system 600a may include a controller or control circuit 605, a timing generator or driver circuit 616 which controls timing and amplitude of an illumination source (illustrated as an array 615 of emitter elements), and an array 610 of detector elements that are configured to generate electrical signals independent of the optical power of the incident photons (illustrated by way of example as a SPAD array). The emitter array 615 emits a radiation pulse as an optical signal 630 at a time controlled by the controller 605 and/or driver circuit 616. Radiation in the form of a reflected optical signal (echo signal) 635 is reflected from a target 650, and is detected or sensed by the SPAD array 610, e.g., as the incident photons 10 described herein. The controller 605 implements a pixel processor that measures the time of flight of the illumination pulse 630, 635 over the journey from emitter array 615 to target 650 and back to the detector array 610, using direct or indirect ToF measurement techniques.

FIG. 6B illustrates a lidar ToF circuit or system 600b in accordance with some embodiments of the present invention in greater detail. The system 600b includes the control circuit 605, a timing circuit 606, the illumination source (illustrated as an emitter array 615 including a plurality of emitters 615e), and the detector array 610 including a plurality of detector pixels 610d. One or more of the emitter elements 615e of the emitter array 615 may define emitter units that respectively emit a radiation pulse or continuous wave signal (for example, through a diffuser or optical filter 614) at a time and repetition rate controlled by a timing generator or driver circuit 616. In particular embodiments, the emitters 615e may be pulsed light sources, such as LEDs or lasers (such as vertical cavity surface emitting lasers (VCSELs) and/or edge-emitting lasers).

In some embodiments, an emitter module or circuit may include the array 615 of emitter elements 615e, a corresponding array of optical elements 613, 614 coupled to one or more of the emitter elements (e.g., lens(es) 613 (such as microlenses) and/or diffusers 614), and the driver circuit 616. In some embodiments, each of the emitter elements 615e in the emitter array 615 is connected to and controlled by a respective driver circuit 616. In other embodiments, respective groups of emitter elements 615e in the emitter array 615 (e.g., emitter elements 615e in spatial proximity to each other), may be connected to a same driver circuit 616. The driver circuit 616 may include one or more driver transistors configured to control the pulse repetition rate, timing and amplitude of the optical emission signals that are output from the emitters 615e.

In some embodiments, a detector module or circuit includes an array 610 of detector pixels 610d, receiver optics 612 (e.g., one or more lenses to collect light over the FoV 690 of the array 610), and receiver electronics (including timing circuit 606) that are configured to power, enable, and disable all or parts of the detector array 610 and to provide timing signals thereto. The receiver optics 612 may include a macro lens that is configured to collect light from the largest FoV that can be imaged by the lidar system, a spectral filter 611 to pass or allow passage of a sufficiently high portion of the 'signal' light (i.e., light of wavelengths corresponding to those of the optical signals output from the emitters) but substantially reject or prevent passage of non-signal or 'background' light (i.e., light of wavelengths different than the optical signals output from the emitters), microlenses to improve the collection efficiency of the detecting pixels, and/or anti-reflective coating to reduce or prevent detection of stray light.

The detector pixels 610d include time-of-flight sensors (for example, an array of single-photon detectors, such as Geiger-mode avalanche diodes (e.g., SPADs)). The detector array 610 may include any of the photodetector devices 100a-100c, 200a-200b, 300, 400, 500 described herein, with each detector pixel 610d including one or more of the photodiodes 105, 105a, 105b described herein that are configured to generate electrical signals independent of the optical power of the incident photons. That is, the detector array 610 may include any combination of the pixel structures represented by the photodetector devices 100a-100c, 200a-200b, 300, 400, 500 described herein.

The timing circuit 606 may control the timing and gain/sensitivity of the detector array 610. The timing circuit 606 for the detector array 610 may be phase-locked to the driver circuit 616 of the emitter array 615 in some embodiments. The timing circuit 606 may also control the sensitivity of each of the detector pixels 610d, groups of detector pixels, or respective photodiodes of each detector pixels 610d. For example, when the detector pixels 610d include reverse-biased Geiger-mode photodiodes, the reverse bias applied to each photodiode may be adjusted (e.g., based on a voltage differential of the electrodes 107n, 107p described herein), whereby, the higher the overbias, the higher the sensitivity. The detector pixels 610d can be activated or deactivated with at least nanosecond precision, and the photodiodes of a detector pixel 610d may be individually addressable, addressable by group, and/or globally addressable.

As shown in FIG. 6B, light emission output from one or more of the emitters 615e impinges on and is reflected by one or more targets 650, and the reflected light is detected as an echo signal by one or more of the detector pixels 610d, converted into electrical signal representations (referred to herein as a detection signals), and processed (e.g., based on time of flight) to define a 3-D point cloud representation 670 of the scene within the field of view 690. Operations of LIDAR systems in accordance with embodiments of the present invention as described herein may be performed by one or more processors or controllers, such as the control circuit 605 of FIGS. 6A and 6B.

Embodiments of the present invention as described herein provide high quantum efficiency Geiger-mode avalanche diodes and optical sensor arrays thereof. Moreover, embodiments of the present invention are directed to sensitivity-enhanced photon-mixing image sensor pixels, which include multiple photodiodes in the same pixel to more uniformly sample the field of view of the pixel. The 'fill-factor' of the sensor array may be increased by reducing or omitting isolation regions (e.g., DTI regions) between photodiodes, which may otherwise occupy the surface of the pixel array and decrease the available pixel area. Textured regions and/or other optical structures as described herein may be positioned in or on the optical sensor array to direct incident photons to any of the multiple photodiodes in the pixel. Some embodiments may sacrifice spatial resolution by using a compound pixel structure with multiple photodiodes per pixel that sample the same angular space between isolation regions. Embodiments of the present invention include but are not limited to the following.

In some embodiments, for example, an optoelectronic device may include a Geiger-mode avalanche photodiode that can include a semiconductor material (e.g., silicon) having an incident light surface, first and second regions (e.g., doped regions) forming a semiconductive junction (e.g., a p-n junction) in the semiconductor material, a guard ring structure to control the avalanche process, and a textured region coupled to the semiconductor material and positioned to interact with electromagnetic radiation. The optoelectronic device has a binary responsivity independent of the impinging optical power, for example, electromagnetic radiation having at least one wavelength in a range of from about 800 nanometers (nm) to about 1200 nm.

In some embodiments, the textured region is positioned on same side of the silicon (or other semiconductor) material as the incident light surface. In some embodiments, the textured region is positioned on an opposite side of the silicon (or other semiconductor) material from the incident light surface.

In some embodiments, the silicon (or other semiconductor) material may have a thickness of from about 1 micrometer ($\mu$m) to about 100 $\mu$m. In some embodiments, the semiconductive junction may have a surface area of from about 0.1 $\mu m^2$ to about 1000 $\mu m^2$.

In some embodiments, the optoelectronic device may be surrounded by structures (e.g., guard ring structures) such that the electrical field formed when the junction is reverse-biased is sufficiently uniform. As such, upon avalanche breakdown, a majority or essentially all of the avalanche current may flow within the planar region of the junction, rather than in edges or corners of the junction.

In some embodiments, the optoelectronic device may include a first contact and a second contact. The first and second contacts may define anode and cathode contacts for the photodiode. The voltage difference between the first and second contacts can be switched between a first voltage which is below (e.g., slightly below) the breakdown voltage of the junction and a second voltage which is higher than the breakdown voltage (e.g., sufficiently higher for avalanche operation). In some embodiments, a reverse bias voltage is applied across the first and second contacts. For example, the reverse bias may be from about 10 V to about 200 V.

In some embodiments, the anode or the cathode or both the anode and the cathode may be electrically connected to a quenching and/or recharge circuit. The quenching operations may be active or passive. The recharge operations may be active or passive.

In some embodiments, a barrier or isolation region may be formed between adjacent photodiodes. The barrier may, without loss of generality, be provided in the form of a trench, a passivated trench, a filled trench, a filled passivated trench, an electrical field defined by electrodes on the front surface of the wafer (e.g., a wafer of silicon material), an electrical field defined by electrodes on the back surface of the wafer, an electrical field defined by electrodes on or in the trenches, and electric field defined by charged Through-Silicon Vias.

In some embodiments, a photodiode array may include a silicon material having an incident light surface, one photodiode formed by a semiconductive junction in the silicon material and defining a respective pixel of the photodiode array, and a textured region coupled to the silicon material and positioned to interact with electromagnetic radiation. The semiconductive junctions of the photodiode array (or portions thereof) are configured to be biased beyond a breakdown voltage such that when a sufficiently instantaneous group of photons, having at least one wavelength in a range of from about 800 nm to about 1200 nm, impinges on each of the junctions, the respective semiconductive junctions generate electrical signals that are independent of the optical power of the sufficiently instantaneous group of photons.

In some embodiments, a photodiode array may include a silicon material having an incident light surface, at least two photodiodes defining a pixel of the photodiode array in the silicon material, each photodiode including a respective semiconductive junction, and a textured region coupled to the silicon material and positioned to interact with electromagnetic radiation. The semiconductive junctions of the photodiode array (or portions thereof) are configured to be biased beyond a breakdown voltage such that when a sufficiently instantaneous group of photons, having at least one wavelength in a range of from about 800 nm to about 1200 nm, impinges on each of the junctions, the respective semiconductive junctions generate electrical signals that are independent of the optical power of the sufficiently instantaneous group of photons.

In some embodiments, the silicon material may have a thickness of from about 1 $\mu$m to about 100 $\mu$m. In some embodiments, each pixel of the photodiode array may include four photodiodes forming a quad array. In some embodiments, the four photodiodes of the quad array may be selective to detect a single wavelength range.

In some embodiments, the photodiode array may include arrays and systems as described in U.S. Patent Application Publication No. 2019/0250257, which is incorporated by reference herein, where a silicon wafer including SPAD devices further includes a textured region that is coupled to the silicon material and is positioned to interact with electromagnetic radiation. In some embodiments, the wafer including the SPAD devices may be backside illuminated. In some embodiments, the wafer including the SPAD devices may include only SPAD devices (e.g., the wafer may be free of non-SPAD devices), and the wafer including the SPAD devices may be further bonded and/or electrically interconnected to a second wafer including circuitry configured for the operation of the LIDAR system.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity. Like reference numbers may refer to like elements throughout.

The example embodiments are mainly described in terms of particular methods and devices provided in particular implementations. However, the methods and devices may operate effectively in other implementations. Phrases such as "some embodiments", "one embodiment" and "another embodiment" may refer to the same or different embodiments as well as to multiple embodiments. The embodiments will be described with respect to systems and/or devices having certain components. However, the systems and/or devices may include fewer or additional components than those shown, and variations in the arrangement and type of the components may be made without departing from the scope of the inventive concepts. The example embodiments will also be described in the context of particular methods having certain steps or operations. However, the methods and devices may operate effectively for other methods having different and/or additional steps/operations and steps/operations in different orders that are not inconsistent with the example embodiments. Thus, the present inventive concepts are not intended to be limited to the embodiments shown, but are to be accorded the widest scope consistent with the principles and features described herein.

It will be understood that when an element is referred to or illustrated as being "on," "connected," or "coupled" to another element, it can be directly on, connected, or coupled to the other element, or intervening elements may be present. In contrast, when an element is referred to as being "directly on," "directly connected," or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise.

It will also be understood that the term "and/or" as used herein refers to and encompasses any and all possible combinations of one or more of the associated listed items. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All mentioned patents and/or publications are incorporated by reference herein.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments of the present invention described herein, and of the manner and process of making and using them, and shall support claims to any such combination or subcombination.

Although the invention has been described herein with reference to various embodiments, it will be appreciated that further variations and modifications may be made within the scope and spirit of the principles of the invention. Although specific terms are employed, they are used in a generic and descriptive sense only and not for purposes of limitation.

The invention claimed is:

1. A photodetector device, comprising:
a semiconductor material layer;
at least one photodiode in the semiconductor material layer that is configured to be biased beyond a breakdown voltage thereof to generate respective electrical signals responsive to detection of incident photons, wherein the respective electrical signals are independent of an optical power of the incident photons; and
a textured region coupled to the semiconductor material layer and comprising optical structures positioned to interact with the incident photons in the detection thereof by the at least one photodiode.

2. The photodetector device of claim 1, wherein the at least one photodiode comprises two or more photodiodes that define a pixel of the photodetector device, and wherein the optical structures are configured to direct the incident photons to any of the two or more photodiodes of the pixel for the detection thereby.

3. The photodetector device of claim 2, further comprising:
respective isolation regions separating the pixel from neighboring pixels of the photodetector device, wherein the pixel is free of the respective isolation regions between the two or more photodiodes thereof.

4. The photodetector device of claim 3, wherein the respective isolation regions comprise respective deep trench isolation (DTI) regions, and further comprising:
a shallower trench isolation (SrTI) structure between the two more photodiodes in the pixel, wherein the respective DTI regions protrude away from the two or more photodiodes beyond the SrTI structure.

5. The photodetector device of claim 3, wherein, responsive to the detection of the incident photons by any of the two or more photodiodes, the respective electrical signals generated by the any of the two or more photodiodes are configured to be output to respective processing paths comprising respective electronic circuit elements that are not shared by the two or more photodiodes of the pixel.

6. The photodetector device of claim 5, further comprising:
a readout wafer comprising the respective electronic circuit elements, wherein the semiconductor material layer is stacked on a surface of the readout wafer.

7. The photodetector device of claim 6, wherein the respective electronic circuit elements comprise respective quenching and/or recharge circuits.

8. The photodetector device of claim 6, further comprising:
metal layer structures in the readout wafer adjacent the surface thereof, wherein the metal layer structures extend beneath the two or more photodiodes and are configured to provide electrical signals thereto or therefrom.

9. The photodetector device of claim 8, wherein the respective electronic circuit elements comprise an analog time integrator or an analog counter and the metal layer structures comprise integrating or counting capacitors thereof.

10. The photodetector device of claim 3, wherein the optical structures are configured to direct the incident photons away from one of the two or more photodiodes of the pixel before the detection by the any of the two or more photodiodes.

11. The photodetector device of claim 10, wherein the optical structures are diffractive elements respectively comprising one or more dimensions smaller than a wavelength of the incident photons, wherein the diffractive elements comprise inverted pyramidal array (IPA) structures.

12. The photodetector device of claim 2, wherein at least one of the two or more photodiodes in the pixel are configured to be disabled independent of one another.

13. The photodetector device of claim 12, further comprising:
trench isolation regions separating the pixel from neighboring pixels of the photodetector device; and
first and second electrodes configured to apply a reverse bias to the at least one of the two or more photodiodes of the pixel based on a voltage difference therebetween, wherein the voltage difference is switchable between a first voltage that is greater than the breakdown voltage, and a second voltage that is less than the breakdown voltage.

14. The photodetector device of claim 1, wherein the at least one photodiode comprises at least one single photon avalanche detector (SPAD) having a respective semiconductor junction comprising a substantially planar region and a guard ring structure at edges thereof.

15. The photodetector device of claim 1, wherein the photodetector device comprises an optical sensor array that includes the at least one photodiode among a plurality of pixels thereof, wherein the optical sensor array is a light detection and ranging (LIDAR) detector array, and wherein a source of the incident photons is a LIDAR emitter array.

16. An optical sensor array, comprising:
a plurality of pixels, each of the pixels comprising two or more photodiodes that are configured to generate respective electrical signals responsive to incident photons, wherein the respective electrical signals are independent of an optical power of the incident photons;
respective isolation regions separating neighboring ones of the pixels; and
optical structures positioned between the respective isolation regions and configured to direct the incident photons to any of the two or more photodiodes of each of the pixels.

17. The optical sensor array of claim 16, wherein the pixels are free of the respective isolation regions between the two or more photodiodes thereof, and wherein the optical structures are configured to direct the incident photons away from one of the two or more photodiodes of each of the pixels before detection by the any of the two or more photodiodes.

18. The optical sensor array of claim 17, wherein the respective isolation regions comprise respective deep trench isolation (DTI) regions, and further comprising:
a shallower trench isolation (SrTI) structure between the two more photodiodes in the pixel, wherein the respective DTI regions protrude away from the two or more photodiodes beyond the SrTI structure.

19. The optical sensor array of claim 17, wherein the optical structures are diffractive elements respectively comprising one or more dimensions smaller than a wavelength of the incident photons, and wherein the diffractive elements are configured to direct the incident photons to the any of the two or more photodiodes of each of the pixels with optical path lengths that are greater than a distance between a surface of the optical sensor array and the one of the two or more photodiodes.

20. The optical sensor array of claim 16, wherein the two or more photodiodes respectively comprise a semiconductive junction that comprises a substantially planar region and a guard ring structure at edges thereof, and the semiconductive junction is configured to be biased beyond a breakdown voltage thereof to generate the respective electrical signals responsive to the incident photons.

21. The optical sensor array of claim 20, wherein, responsive to detection of the incident photons by the any of the two or more photodiodes, the respective electrical signals generated by the any of the two or more photodiodes are configured to be output to respective processing paths comprising respective electronic circuit elements that are not shared by the two or more photodiodes of each of the pixels.

22. The optical sensor array of claim 21, wherein the pixels, the respective isolation regions, and the optical structures are provided in or on a first semiconductor layer, and further comprising:
a second semiconductor layer comprising the respective electronic circuit elements, wherein the first semiconductor layer is bonded to a surface of the second semiconductor layer.

23. The optical sensor array of claim 22, wherein the second semiconductor layer further comprises a controller configured to receive the respective electrical signals generated by the two or more photodiodes of each of the pixels and perform temporal correlation between respective times of arrival indicated by the respective electrical signals.

24. The optical sensor array of claim 21, wherein the optical sensor array is a light detection and ranging (LIDAR) detector array, and wherein a source of the incident photons is a flash LIDAR emitter array.

25. The optical sensor array of claim 21, wherein the optical sensor array is a light detection and ranging (LIDAR) detector array, and wherein a source of the incident photons is a scanning LIDAR emitter array.

26. A light detection and ranging (LIDAR) detector array, comprising:
- a semiconductor material layer having a thickness of about 1 µm to about 100 µm;
- a plurality of pixels in the semiconductor material layer, the pixels respectively comprising at least one photodiode defined by a semiconductive junction that comprises a substantially planar region and a guard ring structure at edges thereof and configured to generate an electrical signal responsive to incident photons comprising a wavelength between about 800 nanometers (nm) to about 1200 nm when a reverse bias applied thereto is beyond a breakdown voltage thereof, wherein the electrical signal is independent of an optical power of the incident photons;
- respective deep trench isolation regions separating neighboring ones of the pixels;
- first and second contacts in each of the pixels adjacent the respective deep trench isolation regions, wherein the first and second contacts are configured to apply the reverse bias to the semiconductive junction based on a voltage difference therebetween; and
- diffractive optical elements positioned between the pixels and a source of the incident photons.

* * * * *